(12) United States Patent
Wada

(10) Patent No.: US 7,795,527 B2
(45) Date of Patent: Sep. 14, 2010

(54) SOLAR CELL MODULE AND METHOD FOR INSTALLING SAME

(75) Inventor: Takehito Wada, Chiba (JP)

(73) Assignee: Fuji Electric Systems Co., Ltd., Tokyo (JP)

(*) Notice: Subject to any disclaimer, the term of this patent is extended or adjusted under 35 U.S.C. 154(b) by 414 days.

(21) Appl. No.: 11/312,839

(22) Filed: Dec. 21, 2005

(65) Prior Publication Data
US 2006/0151024 A1 Jul. 13, 2006

(30) Foreign Application Priority Data
Dec. 22, 2004 (JP) .............................. 2004-370312

(51) Int. Cl.
H01L 31/00 (2006.01)
H02N 6/00 (2006.01)

(52) U.S. Cl. ..................... 136/243; 136/251; 136/244

(58) Field of Classification Search ................ 136/243, 136/244, 251
See application file for complete search history.

(56) References Cited

U.S. PATENT DOCUMENTS 6,670,540 B2* 12/2003 Kular ......................... 136/245

2003/0098060 A1 5/2003 Yoshimi
2004/0055633 A1* 3/2004 Lambey ...................... 136/244
2004/0060590 A1* 4/2004 Ojima et al. ................ 136/244

FOREIGN PATENT DOCUMENTS

| JP | 03-079087 | 4/1991 |
| JP | 08139347 | 5/1996 |
| JP | 09-018030 | 1/1997 |
| JP | 10270740 | 10/1998 |
| JP | 11-307799 | 11/1999 |
| JP | 11307799 | 11/1999 |
| JP | 2003188399 | 7/2003 |
| JP | 2005086008 | 3/2005 |
| WO | WO9308605 | 4/1993 |

* cited by examiner

Primary Examiner—Luan V Van
(74) Attorney, Agent, or Firm—Rabin & Berdo, P.C.

(57) ABSTRACT

A solar cell module includes photoelectric converters, and resin surface covering materials covering the light-incident side of photoelectric converters, trenches being formed in the surface covering materials. The trenches extend approximately in parallel to the horizontal plane for a certain length, and in parallel to each other, so as to facilitate, in repairing the damage therein, improving the adhesiveness between the module surface and the bonding portion of a repair material so as to prevent water and contamination from getting into the bonding portion, prevent the solar cell module properties from deteriorating, prevent any ground fault through the water, and prevent the repair material from peeling.

11 Claims, 8 Drawing Sheets

SOLAR CELL MODULE AND METHOD FOR INSTALLING SAME

BACKGROUND OF THE INVENTION

1. Field of the Invention

The invention relates to a solar cell module including photoelectric converters, the surface of the light-incident side thereof being covered with a protective resin material. The invention relates also to the method for installing the solar cell module, for example on a roof.

2. Prior Art

The light-incident side surface of a solar cell module, including photoelectric converters, is covered with only a protective resin material film and a sealant. As a result this surface is often damaged before, during or after installation. While being transported before its installation, it may be damaged by vibrations and impacts, including those caused by falling objects. The solar cell module, including photoelectric converters, are typically bonded to a steel plate or a roofing tile for use, covered only with the protective resin film, without providing any optical glass plate on the light-incident-side surface. Damage is therefore easily caused, for example, by an impact from a tool dropped during installation of the solar cell module, from an impact during construction work by scaffolding after the installation, and by the impact of a falling object during the long term use.

As a result of such damage, water and moisture may get into the solar cell module, causing contamination. When the surface damaged solar cell module goes unrepaired during use, the contamination can lead to peeling of the sealant covering a surface of module at the light-incident side of the photoelectric converter and in the photoelectric converter. As the peeling advances, the additives in the sealant flow out, causing sealant deterioration. The sealant deterioration sometimes causes the properties of the solar cell module to deteriorate further. For example, when the damage is deep, not only is a ground fault caused through water, but also corrosion sometimes is caused in the photoelectric converter.

For preventing the problems caused by damage in the solar cell module surface from getting worse, various techniques for repairing the surface damage have been proposed (cf. JP P Hie. 11 (1999)-307799 A). The proposed techniques prevent moisture or contamination from getting into the solar cell module by covering the surface damage with an adhesive tape and such a repair prevents any damage to the external appearance of the solar cell module, keeps the solar cell module safe and reliable, and prevents the performance of the solar cell module from deteriorating.

In the solar cell module that includes a light-incident side surface covered with a resin, an emboss sheet is on the surface thereof to quicken deaeration in laminating the constituent layers for the solar cell and to further improve the moldability of the solar cell module. In this type of solar cell module, any unevenness in the embossed sheet is copied to the module surface, so that the module surface has peaks and valleys. Thus, when the damage caused in an uneven surface of the solar cell module is repaired with an adhesive tape, the tape is bonded by the adhesive to the solar cell module surface so as to stick only to the surface peaks where the surface is uneven, and so hardly sticks over the entire module surface.

In other words, according to the prior art, layers of air are left in the valleys on the uneven surface of the solar cell module beneath the bonding plane of the adhesive tape. Since water and contamination due to rainfall get into these air layers, the properties of the solar cell module are easily caused to deteriorate and in the presence of water, a ground fault is easily caused. The bonding portion of the adhesive tape is prone to peel due to the water and contamination, which accumulate in the air layers.

In view of the foregoing, it would be desirable to provide a solar cell module, including photoelectric converters, in which the light-incident side thereof is covered with a protective resin surface covering material, and a method for its installation that facilitates improving the adhesiveness between the module surface and the bonding portion of a repair material that prevents water and contamination from getting into the bonding portion, prevents the solar cell module properties from deteriorating, prevents ground faults through the water, and prevents the repair material from peeling.

SUMMARY OF THE INVENTION

According to a first aspect of the invention, a solar cell module includes a photoelectric converter including a light-incident side surface covered with a surface covering material. Trenches are provided in the light-incident side surface. The trenches extend for a particular length almost (approximately) in parallel to the horizontal plane; and are arranged almost (approximately) in parallel to each other in the surface of the solar cell module. Preferably, the cross section of the trench has a rectangular, trapezoidal or semicircular shape.

For one set of solar cell modules, it is preferable to arrange the trenches almost (approximately) in parallel to the surface of a module and in parallel to the horizontal plane of the module. In other words, it is preferable to arrange multiple lines of trenches in the longitudinal direction thereof and multiple rows of trenches perpendicularly to the longitudinal direction.

Advantageously, the trenches are formed to have a certain width in the longitudinal direction thereof within a range of numerical values.

According to a second aspect of the invention, a method is provided for installing a solar cell module including photoelectric converters, with a light-incident side surface covered with a covering material. The method includes forming trenches in the light-incident side surface such that the trenches extend for a certain length; and mounting the solar cell module on a module supporting material such that the trenches extend almost (approximately) in parallel to the horizontal plane and to each other.

According to the invention, trenches are formed in the light-incident side surface of the surface covering material covering the light-incident side surface of the photoelectric converters of the solar cell module such that the trenches, which have a certain width in the longitudinal direction thereof or widths changing alternately in the longitudinal direction thereof, are extended for a certain length, and the module is mounted on a supporting material such that the trenches are almost (approximately) parallel to the horizontal plane and parallel to each other. Therefore, when damage in the module surface is covered with an adhesive tape and such a repair material in order to use the solar cell module again, water and contamination hardly flow in the longitudinal direction of the trenches. Moreover, in the usual mode of installing the solar cell module, in which the solar cell module is mounted on the supporting material at a certain tilt angle, at which the solar cell module is facing to the source of solar radiation i.e. the sun, the water and the contamination are prevented from getting into the bonding portion of the repair material in the longitudinal direction of the trenches, i.e. almost (approximately) parallel to the horizontal plane. The water and the contamination are prevented by the top surfaces of the land portions between the trenches from getting into the bonding portion of the repair material from the direction tilting to the longitudinal direction of the parallel trenches,.

According to the invention, since water and contamination are prevented from getting into the bonding portion of the repair material, the performance of the solar cell module are prevented from being caused to deteriorate by the water and the contamination which have come into the trenches, ground faults and similar trouble are prevented from occurring through the water. Moreover, adhesive force reduction in the bonding portion of the repair material is prevented, the repair material is prevented from peeling due to such adhesive force reduction, the performance of the solar cell module is stabilized, and the durability of the solar cell module after the repair is improved.

DETAILED DESCRIPTION OF THE PREFERRED EMBODIMENTS

Now the invention will be described in detail with reference to the accompanying drawing figures, which illustrate the preferred embodiments of the invention.

First embodiment

Figure 1:
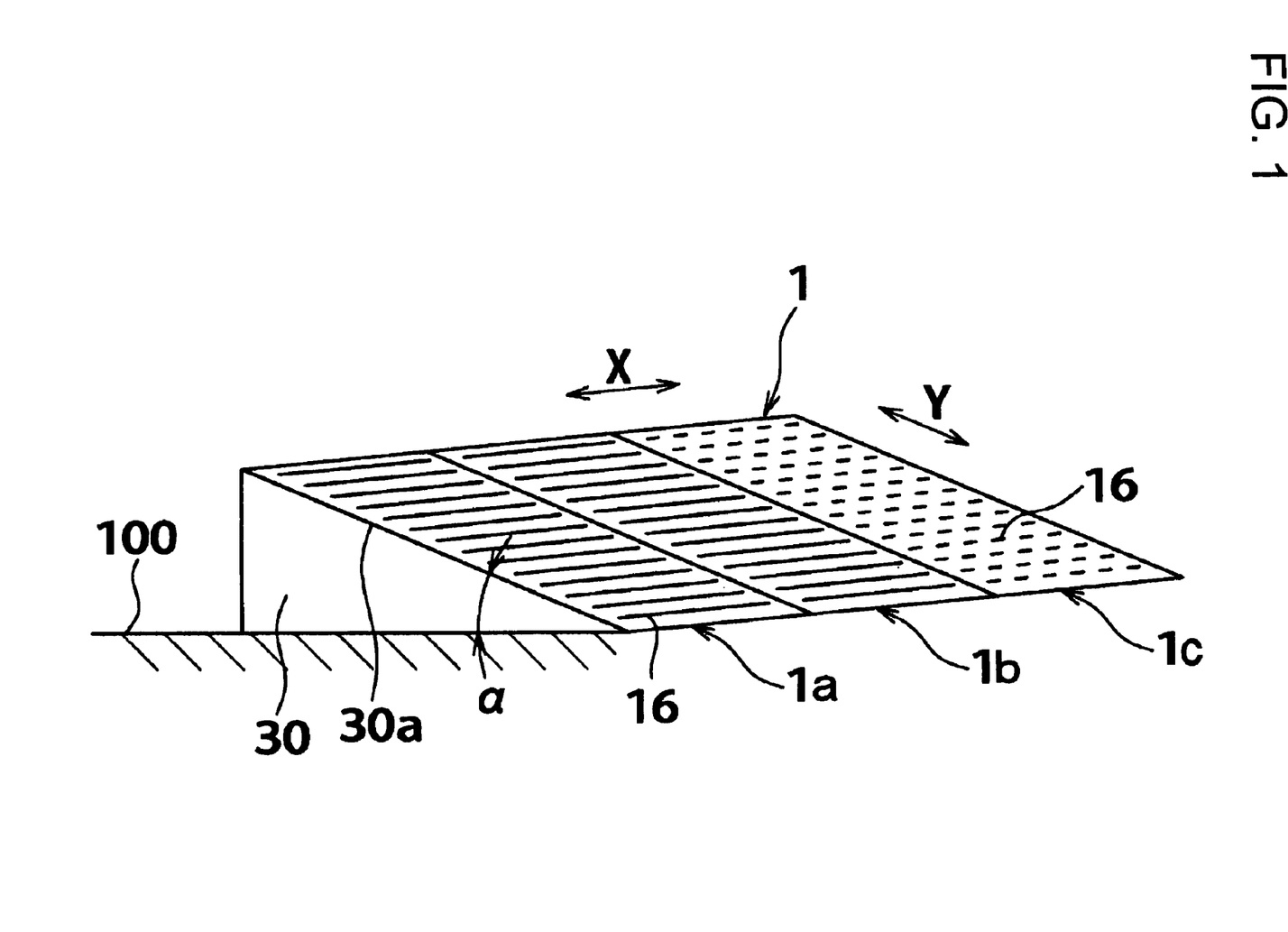
FIG. 1 is a perspective view of solar cell modules showing the mounted state thereof according to a first embodiment of the invention.

FIG. 1 is a perspective view of a solar cell module set including solar cell modules in a mounted state according to the first embodiment of the invention. FIG. 1 shows a solar cell module set 1, including solar cell modules 1a, 1b, and 1c and a module supporting material 30. Module supporting material 30 is tilted to the horizontal plane at a tilt angle α so that the solar light enters the solar cell module perpendicularly thereto. The three solar cell modules 1a, 1b, and 1c are arranged in the lateral direction on the tilting mounting plane 30a of module supporting material 30. In the following, the reference numeral 1 designates a solar cell module set or solar cell modules collectively.

Solar cell module set 1 may be mounted on the roof of a structure via module supporting material 30 such that solar cell modules 1a through 1c and roofing materials are formed into a single unit. Alternatively, solar cell module set 1 may be mounted via module supporting material 30 mounted on a rack disposed on a structure. Alternatively, solar cell module set 1 may be stuck on a wall surface or on a curved surface.

Although solar cell module set 1 is tilted preferably southward, as shown in FIG. 1, to receive many solar rays, solar cell module set 1 may be facing westward, northward or other arbitrary direction, depending on the shape and the tilt of the structure.

In solar cell module set 1, trenches 16 having a certain length are oriented such that trenches 16 are extending in an X-direction almost (approximately) parallel to the horizontal plane and in parallel to each other. As in solar cell module 1a or 1b, a line of trench 16 extends in the X-direction throughout solar cell module 1a or 1b and multiple rows of trenches 16 are arranged in parallel to each other in a Y-direction perpendicular to the X-direction. Or, as in solar cell module 1c, multiple lines of trenches 16 are arranged in the X-direction and multiple rows of multiple trenches 16 are arranged in the Y-direction. Solar cell modules 1a, 1b and 1c of solar cell module set 1 are mounted on mounting plane 30a of module supporting material 30.

Figure 2A:
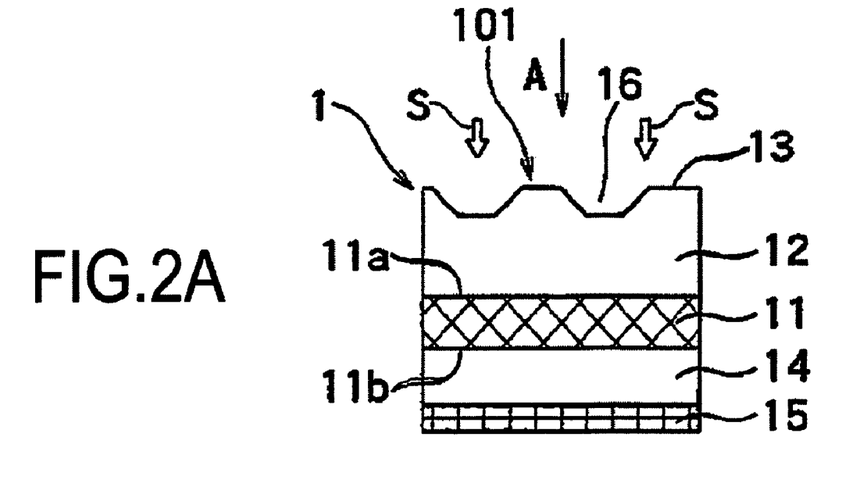
FIG. 2A is a cross-sectional view of the solar cell module according to the first embodiment of the invention.
Figure 2B:
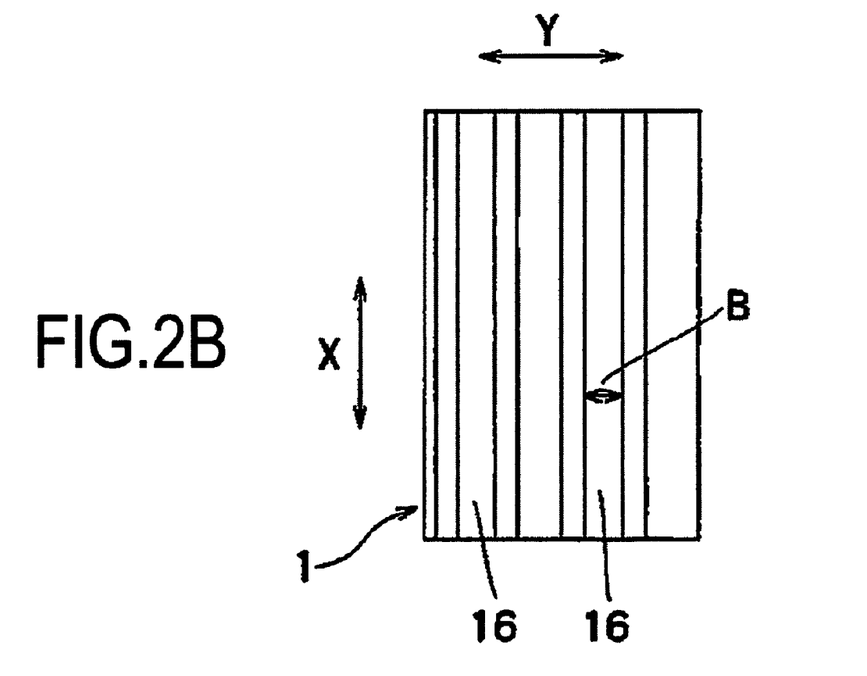
FIG. 2B is a top plan view of the solar cell module seen in the direction of the arrow A shown in FIG. 2A.

FIG. 2A is a cross-sectional view of a solar cell module 1 according to the first embodiment of the invention. FIG. 2B is a top plan view of the solar cell module taken in the direction of the arrow A shown in FIG. 2A.

Referring to these figures, solar cell module 1 includes a photoelectric converter 11 in its core, and a light-incident-side sealing material 12 and a protector sheet 13 laminated on the light-incident side (side receiving the light indicated by the arrows S) of photoelectric converter 11. Light-incident-side sealing material 12 and protector sheet 13 constitute a surface covering material.

On the side opposite to the light-incident side of photoelectric converter 11 (hereinafter referred to as the "mounting side"), a mounting side sealing material 14 is laminated on a supporting base board 15. The supporting base board 15 works as a mounting plane, across which the solar cell module 1 is mounted on module supporting material 30.

Trenches 16 having a certain length are embossed in the light-incident-side surfaces of protector sheet 13 and light-incident-side sealing material 12. Each trench has a trapezoidal cross section having a width B, as shown in FIG. 2B. Solar cell module 1 is mounted on module supporting material 30 such that the trenches 16 extend in the X-direction almost (approximately) parallel to the horizontal plane and in parallel to each other, as shown in FIGS. 2A and 2B. In FIG. 2B, the Y-direction is perpendicular to the X-direction.

Figure 5A:
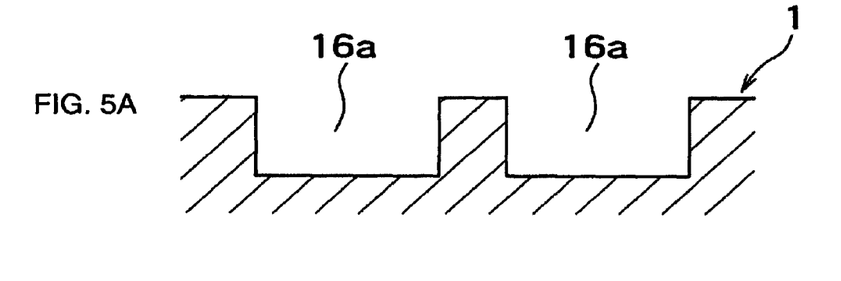
FIG. 5A is an expanded cross-sectional view of the trench according to the first or second embodiment of the invention.
Figure 5B:
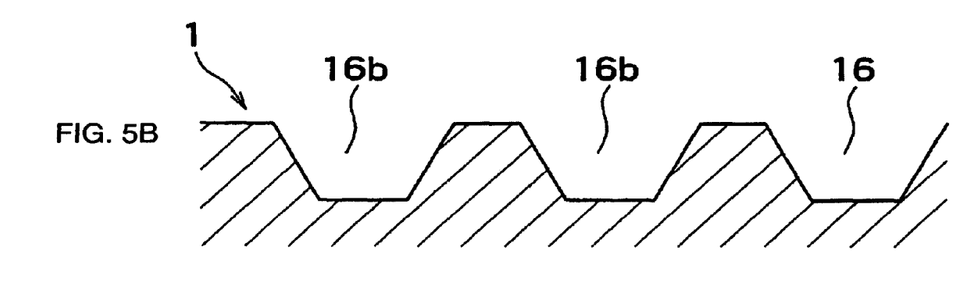
FIG. 5B is another expanded cross-sectional view of the trench according to the first or second embodiment of the invention.
Figure 5C:
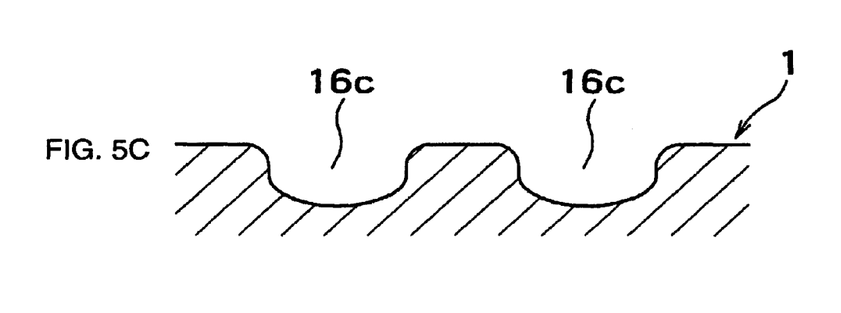
FIG. 5C is still another expanded cross-sectional view of the trench according to the first or second embodiment of the invention.

The cross sections of trenches 16 according to the first embodiment may be trapezoidal as is trench 16b shown in FIG. 5B, rectangular as is the trench 16a shown in FIG. 5A or semicircular as is the trench 16c shown in FIG. 5C.

It is preferably for the shape of trench 16 to provide the adhesive tape used for repair with wide contact areas and to exhibits high adhesiveness. It is necessary to determine the shape of trench 16 in consideration of its relation to the ability of the solar cell module 1 to be molded.

In solar cell module 1 according to the first embodiment, photoelectric converter 11 includes a metal electrode formed as a film on a polyimide substrate, a photoelectric converting element having a tandem structure of amorphous silicon (a-Si) and amorphous silicon germanium (a-SiGe), and an ITO for the transparent electrode on the light-incident side. The tandem structure of a-Si and a-SiGe may be single-layered or triple-layered.

As a substitute for the polyimide substrate, a film of, for example, any of the following resins may be used: polyethylene terephthalate (hereinafter referred to as "PET"), polyethylene naphthalate (hereinafter referred to as "PEN"), polyamide, polycarbonate, poly(butylene terephthalate) (hereinafter referred to as "PBT"), polyphenylene sulfide (hereinafter referred to as "PPS"), a liquid crystal polymer, poly(ethyleneimine) (hereinafter referred to as "PEI") and polyamide-imide (hereinafter referred to as "PAI"). As further alternatives, a stainless steel substrate or a glass substrate may be used.

In place of a-Si and a-SiGe for the tandem structure of photoelectric converter 11, a-C, a-SiC, microcrystalline silicon (hereinafter referred to as "μc-Si"), μc-SiGe, μc-SiC, and μc-Ge may be used. In place of ITO for the transparent electrode, $SnO_2$, ZnO and other transparent electrically conductive films may be used.

Although an ethylene-tetrafluoroethylene copolymer film (hereinafter referred to as an "ETFE film") is used for protector sheet 13, a film of polytetrafluoroethylene (hereinafter referred to as "PTFE"), free erythrocyte protoporphyrin (hereinafter referred to as "FEP"), paraformaldehyde (hereinafter referred to as "PFA"), poly(vinylidene difluoride (hereinafter referred to as "PVDF"), or polyvinyl fluoride (hereinafter referred to as "PVF") may be used. Although the surface covering material on the light-incident side of photoelectric converter 11 has a double-layered structure consisting of light-incident-side sealing material 12 and protector sheet 13 according to the first embodiment of the invention, a triple-layered structure may be used, or a woven glass fiber cloth or an unwoven glass fiber cloth may be inserted.

Although a steel plate is used for supporting base board 15 on the mounting side, alternatively a roofing material, an aluminum plate, or a concrete plate may be used for supporting base board 15. Further, photoelectric converter 11 may be bonded or screwed directly to supporting base board 15 without using mounting side sealing material 14.

The step of bonding protector sheet 13, having trenches 16 formed therein, to photoelectric converter 11 using light-incident-side sealing material 12 is performed by a vacuum lamination process. To avoid poor bonding, the above-mentioned treatment is performed using a peeling sheet having trench-shaped unevenness mounted on protector sheet 13.

According to the preferred embodiment, the vacuum lamination process is performed in the following manner. The protector sheet 13 is a thin film, substantially thinner than the sealing layer 12 (but is shown thicker in the drawings for purposes of illustration). The sealing layer 12, protector sheet 13, pre-laminated photoelectric converter 11, a mounting side sealing material layer 14 and supporting base board 15 are laminated. A peeling sheet having a trench-shape is used in this lamination process. The trench-shape is impressed upon the protector sheet 13 and sealing layer 12. Photoelectric converter 11, mounting side sealing layer 14, and supporting base board 15 are pre-laminated immediately before the lamination of the sheet 13 and layer 12.

As will described below, setting the width B of trenches 16 between 0.5 and 5 mm and their depth between from 0.05 and 1 mm is effective to prevent poor bonding in the step of bonding the protector sheet 13. The pattern as described above is copied to the surface of solar cell module 1 in the laminating process, thereby to determine the shape of the surface of the solar cell module 1.

Figure 3:
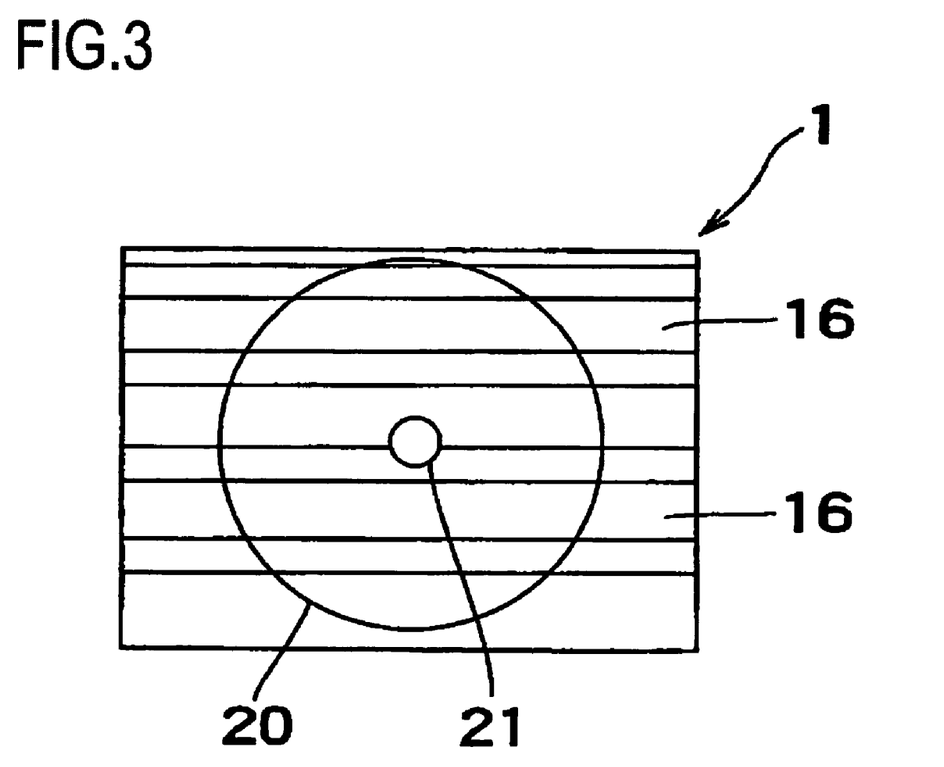
FIG. 3 is a top plan view of the solar cell module showing a repair thereof according to the first embodiment of the invention.

FIG. 3 is a top plan view of solar cell module 1 showing the repair thereof according to the first embodiment of the invention. Referring to FIG. 3, to repair damage 21 in the surface of solar cell module 1 the damage is covered with a repair material 20 as an adhesive tape. An ETFE film, which is the same as the protector sheet 13 and used as the repair material 20, is applied to the protector sheet 13 for repairing the damage 21. Alternatively, any film of PTFE, FEP, PFA, PVDF and PVF may be used as the repair material 20.

Figure 4:
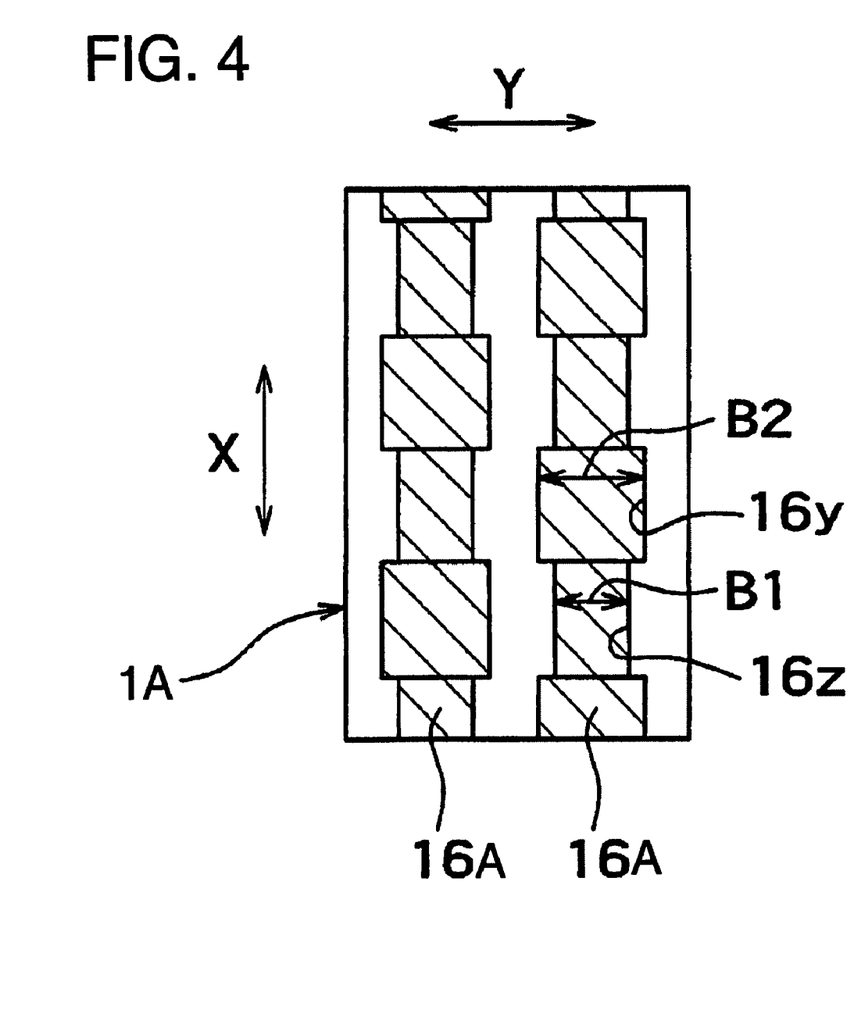
FIG. 4 is a top plan view of a solar cell module according to the second embodiment of the invention.

Since an adhesive for pasting the repair material 20 to protector sheet 13 is required to exhibit certain weather resistance, an acrylic adhesive is used. Alternatively, an adhesive or a glue of a butyl rubber material, a silicone material and a thermoplastic material may be used. Second embodiment FIG. 4 is a top plan view of a solar cell module 1A according to the second embodiment of the invention, in which the shape of trenches is simplified for purposes of explanation. Referring to FIG. 4, solar cell module 1A according to the second embodiment includes trenches 16A, each having narrow sections $16_Z$ with a narrow width B1 in the Y-direction, and wide sections $16_Y$ with a width B2 in the Y-direction wider than B1. Wide sections $16_Y$ and narrow sections $16_Z$ of the trench 16A are arranged alternately in the X-direction. Wide sections $16_Y$ and narrow sections $16_Z$ on the adjacent trenches 16A are arranged alternately in the Y-direction. Although not illustrated, as an alternative, the trenches 16A may be provided with a width B that varies in a wavy manner, rather than abruptly as between B1 and B2 in the illustrated embodiment. The other structures and functions are the same as those of the solar cell module according to the first embodiment.

COMPARATIVE EXAMPLE

Figure 7:
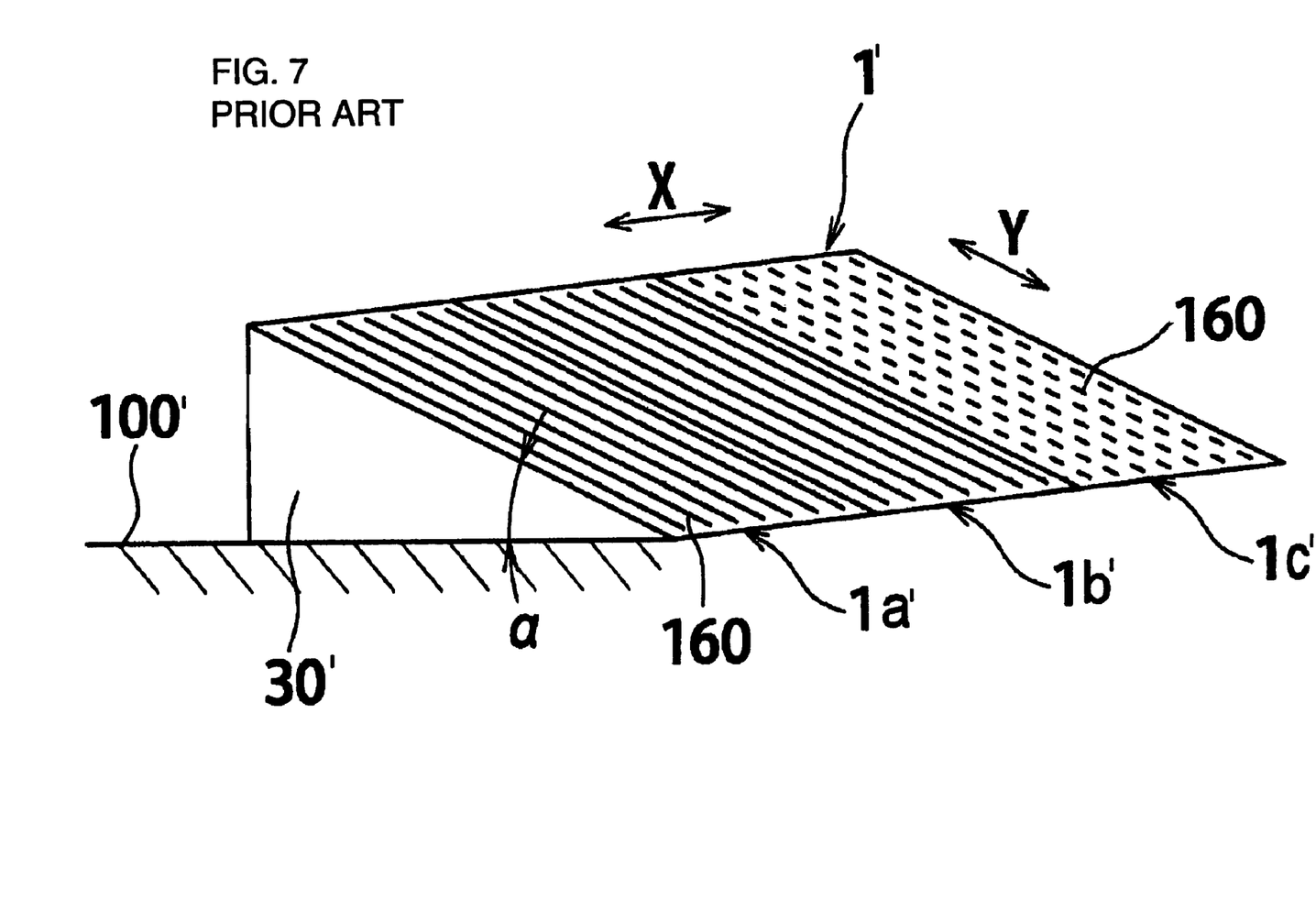
FIG. 7 is a perspective view of a comparative solar cell module set in a mounted state.
Figure 8A:
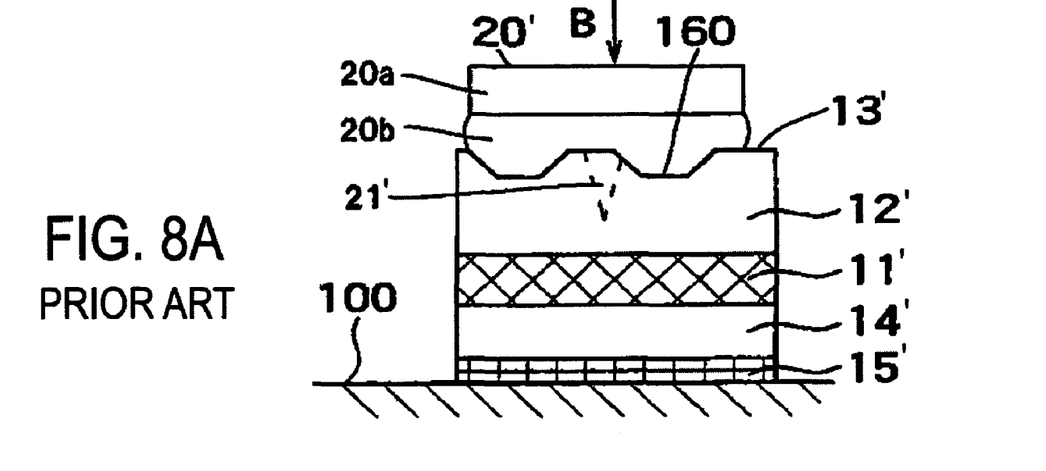
FIG. 8A is a cross-sectional view of the comparative solar cell module of FIG. 7.
Figure 8B:
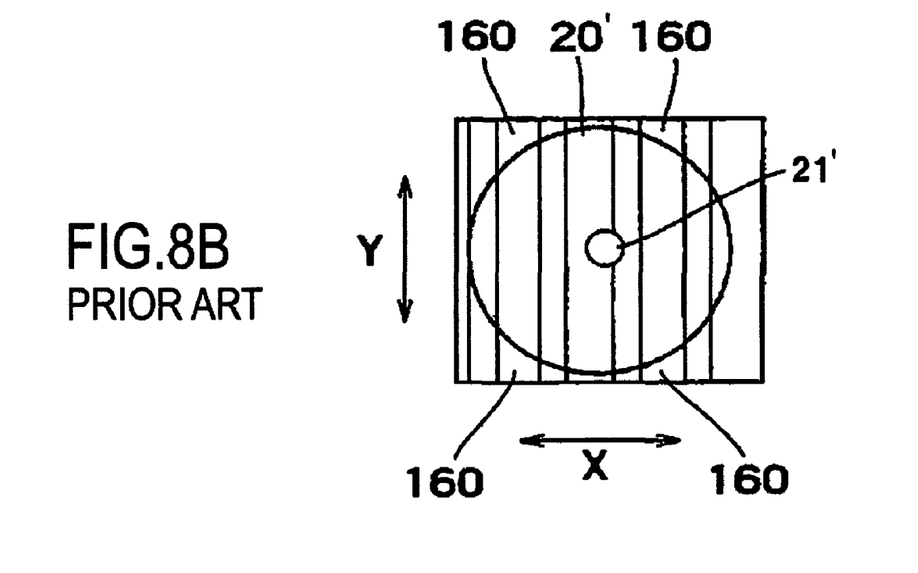
FIG. 8B is a top plan view of the solar cell module taken in the direction of the arrow B shown in FIG. 8A.

FIG. 7 is a perspective view of a comparative solar cell module set. FIG. 8A is a cross-sectional view of the comparative solar cell module of FIG. 7, and FIG. 8B is a top plan view of the solar cell module seen in the direction of the arrow B shown in FIG. 8A, wherein the shape of the trench is exaggerated in the longitudinal direction. In describing below the comparative example shown in FIGS. 7, 8A and 8B, an apostrophe (') is used with the same reference numerals as used for describing the solar cell modules according to the first and second embodiments shown in FIGS. 1 through 4 are used to designate the same or corresponding constituent elements.

Referring to FIG. 7, a solar cell module set 1' including solar cell modules (1a', 1b', and 1c') and a module supporting material 30' are shown. Module supporting material 30' is tilted to the horizontal plane at a tilt angle α'. Three solar cell modules 1a', 1b', and 1c' are arranged in the lateral direction on the tilting mounting plane 30a' of module supporting material 30'.

In the solar cell module 1a or 1b, trenches 160 extend across solar cell module 1a' or 1b' in the Y-direction and arranged in parallel to each other in the X-direction almost (approximately) parallel to horizontal plane 100'. In solar cell module 1c', multiple trenches 160 are aligned in the Y-direction and multiple lines of aligned trenches 160 are arranged in parallel to each other in the X-direction almost (approximately) parallel to horizontal plane 100'. Trenches 160 are shaped in the same manner as in the first or second embodiment.

In other words, trenches 160 in FIG. 7 extend perpendicularly to trenches 16 in FIG. 1. The comparative solar cell module set 1 is mounted on mounting plane 30a' of module supporting member 30' such that the width direction of trenches 160 is in the X-direction almost (approximately) parallel to the horizontal plane 100', the longitudinal direction of trenches 160 is in the Y-direction perpendicular to the X-direction, and trenches 160 are parallel to each other in the X-direction.

When damage 21' (which is visible in the drawing because the adhesive tape is transparent) occurs in the surface of the comparative solar cell module set 1', it is repaired by covering it with repair material 20' formed of an adhesive tape including a film 20'a and an adhesive 20'b in FIG. 8B. Since a gap is liable to be caused between repair material 20' and the surface of solar cell module 1' as shown in FIG. 8A, water and contamination flow in the longitudinal direction of trenches 160 in FIG. 7, i.e. in the Y-direction, and, then, is liable to get into the bonding portion of repair material 20' from the gap. Due to the penetration of the water and contamination, the adhesive force of repair material 20' is caused to deteriorate, making the repair material 20' prone to peeling from the surface of solar cell module set 1'.

According to the first embodiment, trenches 16, having a certain length and extending in parallel to each other, are formed in the light-incident side surface of a surface covering material (formed of light-incident-side sealing material 12 and protector sheet 13) covering the light-incident side surface of photoelectric converter in solar cell module 1. The solar cell module 1 is mounted on module supporting material 30 in such an orientation that all the trenches 16 extend in the X-direction almost (approximately) parallel to the horizontal plane 100.

According to the second embodiment, trenches 16A, each having narrow sections of width B1, and wide sections of width B2 wider than B1, arranged alternately in the longitudinal direction thereof, are formed in the light-incident side surface of a surface covering material (formed of light-incident-side sealing material 12 and protector sheet 13) covering the light-incident side surface of photoelectric converter in solar cell module 1A. The solar cell module 1A of the second embodiment is mounted on module supporting material 30 in such an orientation that all the trenches 16A are extending in the X-direction almost (approximately) parallel to the horizontal plane 100. Trenches 16A are parallel to each other in the Y-direction perpendicular to the X-direction.

Solar cell modules 1 and 1A according to the first and second embodiments of the invention, respectively, having damage caused in the surface thereof and covered with repair material 20 including an adhesive tape, is mounted on supporting material 30 to use solar cell module again in the usual mode of installation at a certain tilt angle α, at which the solar cell module is facing toward the solar ray side. That is, the tilt angle preferably is nearly equal to an angle at which the solar light enters the solar cell module perpendicularly to the plane of the supporting material and thus to the light-incident side surface. When solar cell module is used in the usual mode of installation, water and contamination hardly flow in the longitudinal direction of the trenches, i.e. the X-direction almost (approximately) parallel to the horizontal plane 100, and water and contamination are prevented by the top surfaces of the land portions between the trenches from penetrating from the Y-direction, i.e. the direction perpendicular to the longitudinal direction of the trenches. According to the first and second embodiments of the invention, water and contamination are prevented from getting into the bonding portion of repair material 20. Therefore, the properties of the solar cell module are prevented from being caused to deteriorate by the water and contamination that have come into the trenches. Moreover, ground faults and similar trouble are prevented from occurring through the water, a reduction in the adhesive force is prevented from occurring in the bonding portion of repair material 20, repair material 20 is prevented from peeling from such a lowering of the adhesive force, the performance of the solar cell module is stabilized, and the durability of solar cell module after the repair is improved.

Comparison of Tests and Results

Figure 6A:
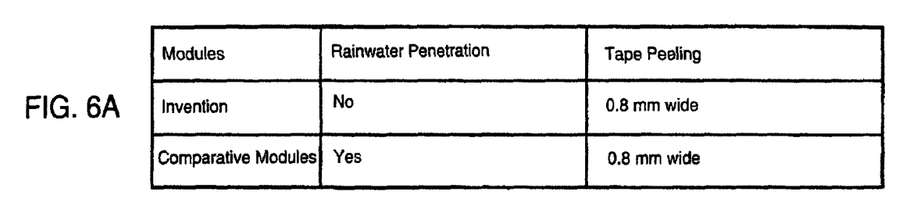
FIG. 6A is a table comparing the test results for the solar cell module according to the first or second embodiment of the invention and test results for the comparative solar cell module.
Figure 6B:
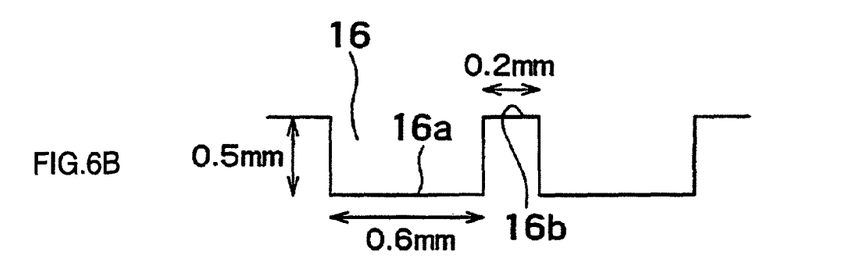
FIG. 6B is a schematic cross-sectional view of the rectangular trench illustrating the test conditions therefor.
Figure 6C:
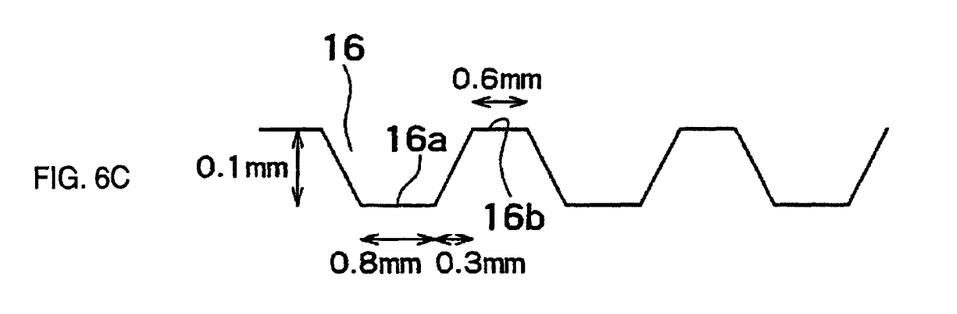
FIG. 6C is a schematic cross-sectional view of the trapezoidal trench illustrating the test conditions therefor.
Figure 6D:
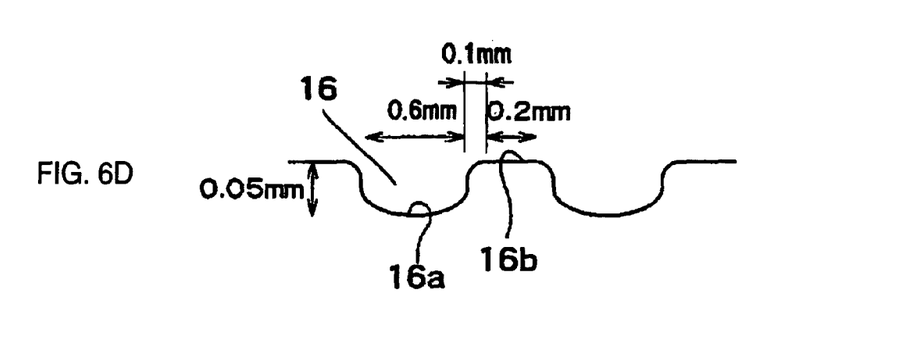
FIG. 6D is a schematic cross-sectional view of the semicircular trench illustrating the test conditions therefor.

FIGS. 6B, 6C and 6D are schematic cross-sectional views respectively of the rectangular, trapezoidal and semicircular (wavy) trenches, illustrating test conditions for when the trenches of the invention and those of the comparative example are so shaped. For purposes of the comparison, a solar cell module 1 is pasted to a steel plate of 0.8 mm in thickness with the trenches 16 extending almost (approximately) in parallel to horizontal plane 100. The trenches 16 are 0.5 mm in depth and 0.6 mm in width. The width of the land between trenches 16 is 0.2 mm.

An ethylene-vinyl acetate copolymer film (hereinafter referred to as an "EVA film") of 0.7 mm in thickness is used for the sealing material in the light-incident-side surface. An ETFE film of 0.05 mm in thickness is used for the protector sheet. The lamination conditions for the vacuum lamination process include deaeration at 120° C. for 2 min, curing at 155° C. for 20 min in a pressurized state, and release from the lamination process after lowering the temperature to 80° C.

A needle having a point angle of 60 degrees and a load of 1 kgf applied thereto, is made to fall from a height of 10 cm onto a solar cell module 1 configured as described above, causing damage thereto. The damaged module is dipped in water to evaluate the insulation performance thereof The insulation resistance is lowered to 60 MΩ or below. Then, an adhesive tape is pasted on the damaged solar cell module such that the distance between the damage and the edge of the adhesive tape is 20 mm. Then, a force of 10 kgf is exerted against the adhesive tape using a roll of 100 mm in width to bond the adhesive tape to the solar cell module 1 under pressure.

The solar cell module 1, repaired as described above, is installed on a plane, facing southward and tilting 30 degrees, exposed for one year, and then evaluated after the final rainfall is over. The evaluation includes an inspection of the external appearance to confirm whether rainwater has penetrated the gap between the adhesive tape and the module, and whether inspection of the adhesive tape is peeling.

The results obtained by the tests described above are listed in a table shown in FIG. 6A. As indicated in the table, no ground fault was caused by the penetration of rainwater into the gap in the solar cell module according to any of the embodiments of the invention. A peeling of 0.8 mm in width is observed in a row of trench 16. Again, these tests were performed for each of the three cross-sectional shapes of the trenches, with similar results.

Comparative solar cell modules (having trenches extending almost (approximately) in parallel to the tilting plane) were fabricated under the same conditions that the solar cell modules according to the first and second embodiments are manufactured, and evaluated under the same conditions that the solar cell modules according to the first and second embodiments were evaluated. As indicated in the table of FIG. 6A, water penetrated the bonding portion of the adhesive tape, causing a ground fault. Wide peeling of 1.8 mm in width has been confirmed. Contamination was been confirmed on the peeling surface. Thus, the comparative tests confirmed the superiority of the solar cell module 1 according to all of the above embodiments of the invention.

The numerical values shown in FIGS. 6B-6D all fall within ranges that also produce acceptable results. Thus, for the rectangularly shaped trenches shown in FIG. 6B, the trench depth preferably should be in the range 0.2-1.0 mm, the trench width preferably should be in the range 0.3 and 1.2 mm, and the land width preferably should be in the range 0.1-0.4 mm. For the trapazoidally shaped trenches shown in FIG. 6C, the trench depth preferably should be in the range 0.05-0.2 mm, the trench width at its base preferably should be in the range 0.4 and 1.6 mm, the transition between the trench base and the land preferably should have a width in the range 0.2-0.6 mm and the land width preferably should be in the range 0.2-1.2 mm. For the semicircle-like-wave-shaped trenches shown in FIG. 6D, the trench depth preferably should be in the range 0.2-1.0 mm, the trench width at its base (bounded by where the sides transition from concave to convex) preferably should be in the range 0.3 and 1.2 mm, the transition between the trench base and the land (concave portion) preferably should have a width in the range 0.05-0.2 mm and the land width preferably should be in the range 0.1-0.4 mm.

Although the invention has been described in connection with specific embodiments thereof, changes and modifications without departing form the true spirits of the invention, will be apparent to those skilled in the art. Therefore, the invention is to be understood not by the specific descriptions herein but by the appended claims thereof

What is claimed is:

1. A solar cell module, comprising:
    a base board having a bottom surface and a top surface, the bottom surface being flat;
    a photoelectric converter on the base board and including a lower surface facing the top surface of the base board and a light-incident side surface;
    a surface covering material that covers the light-incident side surface of the photoelectric converter, the surface covering material having a bottom surface contacting the photoelectric converter and a top surface opposite to the bottom surface, the top surface being shaped to form trenches and projected portions, each projected portion being disposed between two adjacent trenches, each trench having a trench bottom and trench sides, a distance from the bottom surface to the projected portions of the top surface being greater than a distance from the bottom surface to the trench bottom;
    wherein, when the solar cell module is mounted to a surface that is tilted to a horizontal plane, each trench extends in a single direction that is approximately in parallel to the horizontal plane,
    wherein the trenches are arranged approximately in parallel to each other in the light-incident side surface,
    wherein each trench, taken from a plan view of the solar cell module having a first edge and a second edge opposite to the first edge, extends from a region adjacent to the first edge to a region adjacent to the opposite second edge without discontinuity,
    wherein each projected portion, taken from a plan view of the solar cell module, extends from the first edge to the opposite second edge without discontinuity between two adjacent trenches, and wherein each trench, taken from the plan view of the solar cell module, includes narrow sections and wide sections, the narrow sections having a width narrower than a width of the wide sections in a direction perpendicular to said single direction, the narrow sections and the wide sections being arranged alternately in said single direction.

2. The solar cell module according to claim 1, wherein the trenches have a certain width in a horizontal direction thereof.

3. A method for installing a solar cell module including a base board having a bottom surface and a top surface, a photoelectric converter on the base board and having a light-incident side surface and a surface covering material that covers the light-incident side surface of the photoelectric converter, the surface covering material having a bottom surface contacting the photoelectric converter and a top surface opposite to the bottom surface, the method comprising the steps of:
    forming trenches of predetermined length in the surface covering material, such that the top surface is shaped to form the trenches and projected portions, each projected portion being disposed between two adjacent trenches, each trench has a trench bottom and trench sides, and a distance from the bottom surface to the projected portions of the top surface is greater than a distance from the bottom surface to the trench bottom, wherein, taken from a plan view of the solar cell module having a first edge and a second edge opposite to the first edge, each trench extends from a region adjacent to the first edge to a region adjacent to the opposite second edge without discontinuity, and each projected portion extends from the first edge to the opposite second edge without discontinuity between two adjacent trenches; and
    mounting the solar cell module on a surface that is tilted to a horizontal plane, such that each trench extends in a single direction that is approximately in parallel to the horizontal plane and the trenches extend in parallel to each other, wherein the bottom surface of the base board is flat and disposed on the tilted surface, and wherein each trench, taken from the plan view of the solar cell module, includes narrow sections and wide sections, the narrow sections having a width narrower than a width of the wide sections in a direction perpendicular to said single direction, the narrow sections and the wide sections being arranged alternately in said single direction.

4. The method according to claim 3, wherein the solar cell module is mounted on the tilted surface such that the solar cell module is tilted with respect to the horizontal plane at a tilt angle.

5. The method according to claim 4, wherein the tilt angle is an angle at which solar light enters the solar cell module perpendicularly to the light-incident side surface.

6. The method according to claim 3, wherein:
    the tilted surface is tilted to the horizontal plane at a tilt angle, the light-incident side surface being disposed in parallel to the tilted surface, the light-incident side surface being tilted to the horizontal plane in a first direction; and
    the solar cell module is mounted on the tilted surface, such that the single direction is perpendicular to the first direction.

7. The method according to claim 6, wherein the tilt angle is an angle at which solar light enters the solar cell module perpendicularly to the mounting plane.

8. A solar cell device, comprising:
    a module supporting element including a mounting plane tilted to a horizontal plane at an tilt angle; and
    a solar cell module including:

a base board having a bottom surface and a top surface, the bottom surface being flat;

a photoelectric converter on the base board and including a lower surface and a light-incident side surface, the lower surface facing the top surface of the base board, the light-incident side surface being parallel to the mounting plane and being tilted to the horizontal plane; and a surface covering material that covers the light-incident side surface of the photoelectric converter, the surface covering material having a bottom surface contacting the photoelectric converter and a top surface opposite to the bottom surface, the top surface being shaped to form trenches and projected portions, each projected portion being disposed between two adjacent trenches, each trench having a trench bottom and trench sides, a distance from the bottom surface to the projected portions of the top surface being greater than a distance from the bottom surface to the trench bottom, wherein, taken from a plan view of the solar cell module having a first edge and a second edge opposite to the first edge, each trench extends from a region adjacent to the first edge to a region adjacent to the opposite second edge without discontinuity, and each projected portion extends from the first edge to the opposite second edge without discontinuity between two adjacent trenches, wherein, the solar cell module is mounted to the mounting plane tilted to the horizontal plane, with the flat bottom surface of the base board being disposed on the mounting plane, and each trench extends in a single direction that is parallel to the horizontal plane and the trenches extend in parallel to each other, and wherein each trench, taken from the plan view of the solar cell module, includes narrow sections and wide sections, the narrow sections having a width narrower than a width of the wide sections in a direction perpendicular to said single direction, the narrow sections and the wide sections being arranged alternately in said single direction.

9. The solar cell device according to claim 8, wherein the light-incident side surface is tilted to the horizontal plane in a first direction at the tilt angle, and the single direction is perpendicular to the first direction.

10. The solar cell device according to claim 9, wherein the tilt angle is an angle at which solar light enters the solar cell module perpendicularly to the light-incident side surface.

11. The solar cell module according to claim 1, wherein all of two adjacent trenches are spaced apart from each other in the direction perpendicular to said single direction, such that the wide sections and narrow sections, taken from the plan view of the solar cell module, are arranged alternately in the direction perpendicular to said single direction.

* * * * *